United States Patent
Shima (10) Patent No.: US 7,456,473 B2
(45) Date of Patent: Nov. 25, 2008

(54) MOS FIELD EFFECT TRANSISTOR AND MANUFACTURE METHOD THEREOF

(75) Inventor: Masashi Shima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 62 days.

(21) Appl. No.: 11/117,615

(22) Filed: Apr. 29, 2005

(65) Prior Publication Data

US 2006/0157784 A1    Jul. 20, 2006

(30) Foreign Application Priority Data

Jan. 20, 2005    (JP)    ............................. 2005-012508

(51) Int. Cl.
*H01L 27/01*    (2006.01)
*H01L 27/12*    (2006.01)
*H01L 31/0392*    (2006.01)

(52) U.S. Cl. ................................ 257/347; 257/E21.415

(58) Field of Classification Search ......... 257/347–354, 257/507, E21.415
See application file for complete search history.

(56) References Cited

U.S. PATENT DOCUMENTS 6,437,404 B1 * 8/2002 Xiang et al. ................. 257/347

FOREIGN PATENT DOCUMENTS

JP        5-160404       6/1993
JP        2003-174161    6/2003

* cited by examiner

*Primary Examiner*—Thien F Tran
(74) *Attorney, Agent, or Firm*—Westerman, Hattori, Daniels & Adrian, LLP.

(57) ABSTRACT

A method of manufacturing an MOS field effect transistor, which achieves a faster operation and lower power consumption by using a thin film SOI structure, is provided. The method of manufacturing an MOS field effect transistor to be formed on a semiconductor substrate having a channel layer on a buried oxide film, comprises the steps of forming: a gate electrode on the semiconductor substrate via a gate oxide film; forming a first sidewall which covers a side wall of the gate electrode; forming a box oxide film by etching the buried oxide film; and forming a second sidewall which covers a side wall of the box oxide film in such a way that the second sidewall extends downward along the side wall of the box oxide film.

4 Claims, 7 Drawing Sheets

MOS FIELD EFFECT TRANSISTOR AND MANUFACTURE METHOD THEREOF

CROSS-REFERENCE TO RELATED APPLICATIONS

This application is based upon and claims the benefit of priority from the prior Japanese Patent Application No. 2005-12508, filed on Jan. 20, 2005, the entire contents of which are incorporated herein by reference.

BACKGROUND OF THE INVENTION

1) Field of the Invention

The present invention relates to an MOS (Metal Oxide Semiconductor) field effect transistor that has a thin film SOI (Silicon On Insulator) structure, and a method of manufacturing the MOS field effect transistor.

2) Description of the Related Art

For faster information processing and data communication and lower power consumption, there are demands for MOS field effect transistors with enhanced performances which ensures a faster operation with a low leak current. To enhance performances of the MOS field effect transistors at a low cost by miniaturization of the structure, however, the structure must be optimized in consideration of various elements.

To prevent degradation of the performances due to miniaturization, the gate length should be shortened. Reducing the gate length, however, increases a so-called short-channel effect, which reduces the threshold and a source-drain breakdown voltage of a transistor with a decrease in the gate length, thereby increasing a sub threshold value.

To realize a transistor with an excellent characteristic by suppressing the short-channel effect, it is generally necessary to increase impurity concentration of a channel portion according to a decrease in the gate length and increase impurity concentrations of the source/drain regions for a lower parasitic resistance. This leads to an increase in a pn junction capacitance of the source/drain regions and an increase in charge/discharge time of a parasitic capacitor, both of which hinder an improvement in the operation speed.

There is a semiconductor using a substrate having an SOI structure as one which can reduce the pn junction capacitance to increase the operation speed. The SOI structure has a silicon layer (SOI) laminated on a buried oxide film. A thin film SOI structure having a thin SOI layer, in particular, can improve the mobility greatly and reduce the parasitic capacitance significantly, thereby increasing a drive current of the transistor significantly.

For example, Japanese Patent Application Laid-Open No. H5-160404 discloses a technique of forming a thin film transistor thin enough to accomplish complete depletion of a channel region of a silicon (Si) layer and thick enough at a source region and a drain region outside the channel region not to cause spiking of a contact hole.

Japanese Patent Application Laid-Open No. 2003-174161 discloses a technique of improving the performances of MOS transistors by forming a buried oxide in an Si substrate and depositing an SiGeC crystal on Si on the buried oxide.

Since in the thin film SOI structure, an SOI substrate with a uniform SOI film thickness is prepared using complicated manufacture processes, it suffers a high substrate cost and a high manufacture cost. In particular, a thin film SOI substrate of a complete depletion type which is expected to have a significant characteristic improvement becomes very expensive. In the complete depletion type thin film SOI structure, a parasitic part and the channel become thinner, thus making it difficult to reduce the parasitic resistance.

SUMMARY OF THE INVENTION

In view of the above problems, it is an object of the present invention to provide a method of manufacturing an MOS field effect transistor which achieves a faster operation and lower power consumption by using a thin film SOI structure.

It is another object of the present invention to provide an MOS field effect transistor, which is well matched with an existing process and is cost effective, without significantly changing the process steps, by using the manufacture method of the MOS field effect transistor.

In order to solve the above problems, the present invention has the following features.

1. A method of manufacturing an MOS field effect transistor to be formed on a semiconductor substrate having a channel layer on a buried oxide film according to the present invention, comprises the steps of: forming a gate electrode on the semiconductor substrate via a gate oxide film; forming a first sidewall which covers a side wall of the gate electrode; forming a box oxide film by etching the buried oxide film; and forming a second sidewall which covers a side wall of the box oxide film, in such a way that the second sidewall extends downward along the side wall of the box oxide film.

2. An MOS field effect transistor according to the present invention comprises: a semiconductor substrate having a box oxide film; a channel layer on the box oxide film; a gate electrode on the channel layer via a gate insulating film; a first sidewall which covers the gate electrode; and a second sidewall which covers the box oxide film and extends downward from a bottom face of the box oxide film.

BRIEF DESCRIPTION OF THE DRAWINGS

FIGS. 2A to 2C are diagrams showing a manufacture process for an MOS field effect transistor according to a first embodiment, in which

FIGS. 3D to 3F are diagrams showing the manufacture process for the MOS field effect transistor according to the first embodiment, in which

FIGS. 4G and 4H are diagrams showing the manufacture process for the MOS field effect transistor according to the first embodiment, in which

FIGS. 5A to 5C are diagrams showing a manufacture process for an MOS field effect transistor according to a second embodiment, in which

FIGS. 6D to 6F are diagrams showing the manufacture process for the MOS field effect transistor according to the second embodiment, in which FIGS. 7G and 7H are diagrams showing the manufacture process for the MOS field effect transistor according to the second embodiment, in which

DETAILED DESCRIPTION OF THE PREFERRED EMBODIMENTS

Exemplary embodiments of the present invention will be explained below with reference to the drawings. The following explanation is considered as illustrative only, and since variously changed and modified embodiments other than the one described can be made within the scope of the spirit of the appended claims by those skilled in the art, the embodiments do not limit the scope of the present invention.

Figure 1:
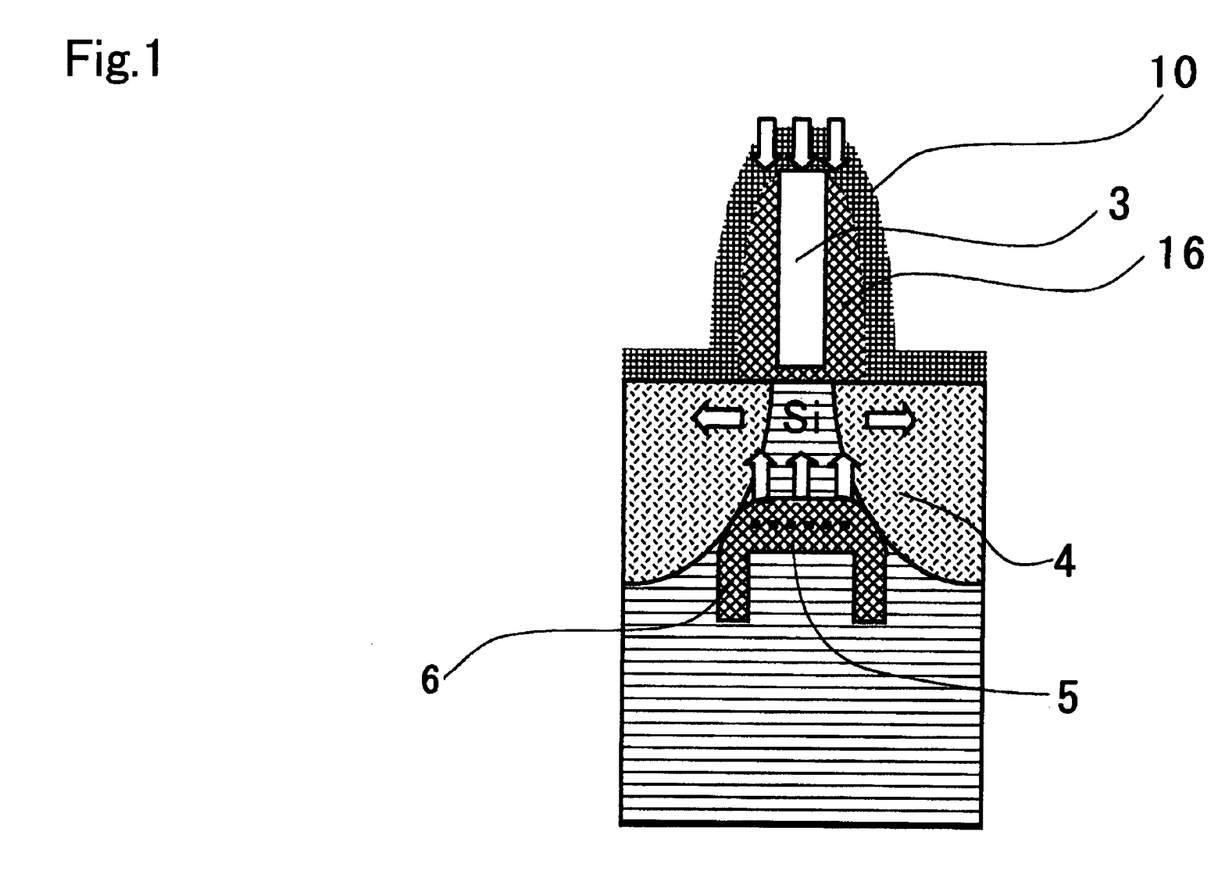
FIG. 1 is a diagram showing the structure of an MOS field effect transistor according to the present invention.

FIG. 1 is a diagram showing the structure of an MOS field effect transistor according to the present invention.

As shown in FIG. 1, a box oxide film 5 is formed only under a channel region in a range directly underlying a first sidewall 16 on a side wall of a gate electrode 3, and is not formed directly under source/drain regions. Even when an SOI film is thin, therefore, the thickness of a parasitic region 4 can be secured sufficiently to reduce a parasitic resistance. A second sidewall is formed self-aligned with the first sidewall on the gate electrode 3, and extends downward along the side wall of the box oxide film in such a way as to overlie a pn junction interface of the source/drain regions. This can reduce junction capacitance to make the transistor faster.

Using a commercially available CVD apparatus, the structure can be prepared by growing a heterojunction layer containing, for example, SiGe as a material which can be selectively etched together with Si, on an Si substrate, replacing that layer with a silicon oxide film, and then forming the second sidewall on the side wall of the silicon oxide film. This eliminates the need for the SOI substrate and reduces the manufacture cost by elimination of the cost for the SOI substrate.

Forming the box oxide film 5 under the channel in a thermal oxidization step can permit in-plane tensile stress to be applied to the channel Si, thereby improving the mobility and making the operation speed faster.

EMBODIMENTS

The present invention is further explained below with reference to embodiments, but the present invention is not limited to the embodiments.

First Embodiment

Figure 2:
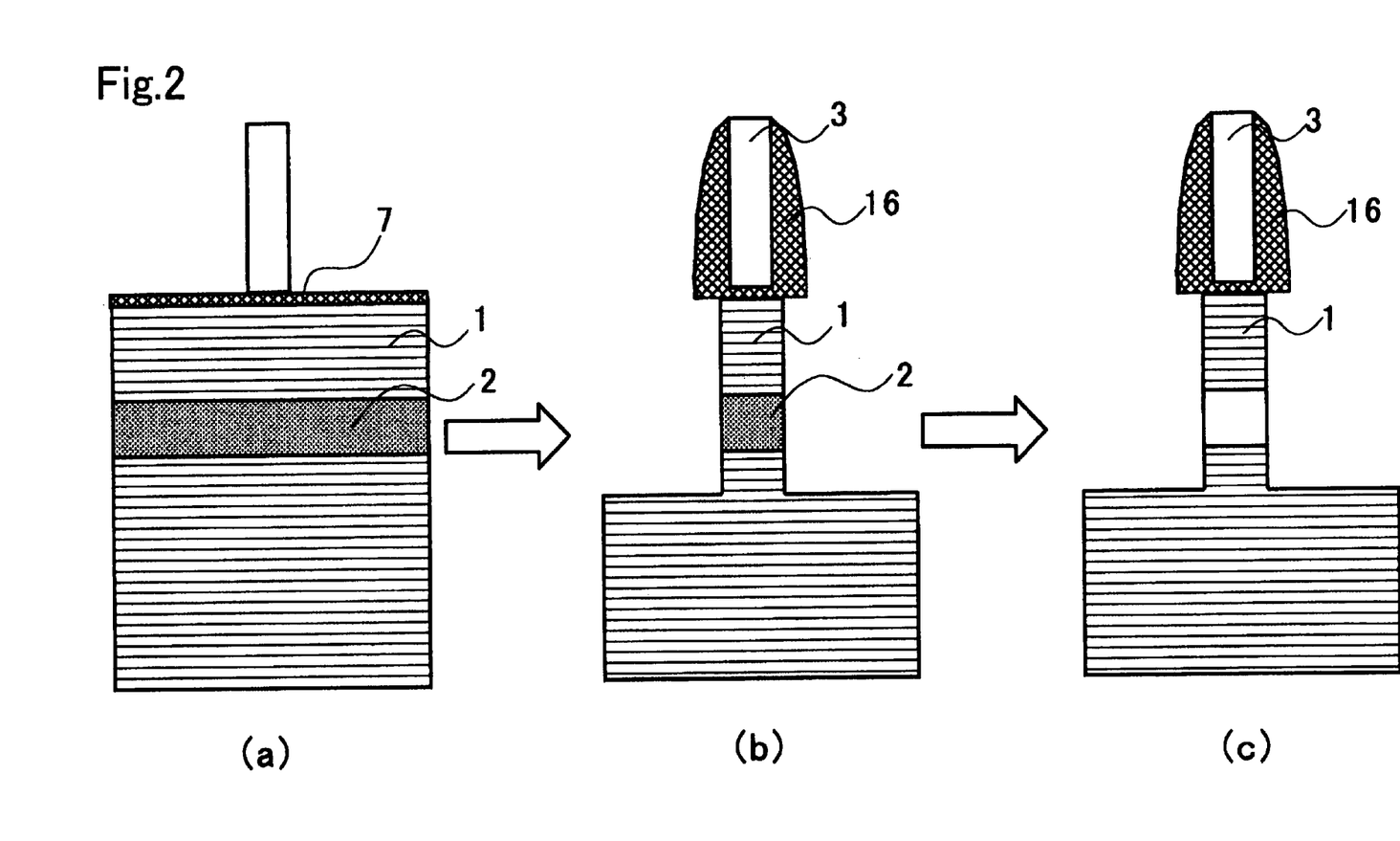
FIG. 2A shows a state in which a gate insulating film and a gate electrode are formed in an Si/SiGe lamination structure.
FIG. 2B shows a state in which source/drain regions are etched.
FIG. 2C shows a state in which an Si/SiGe layer is removed.
Figure 3:
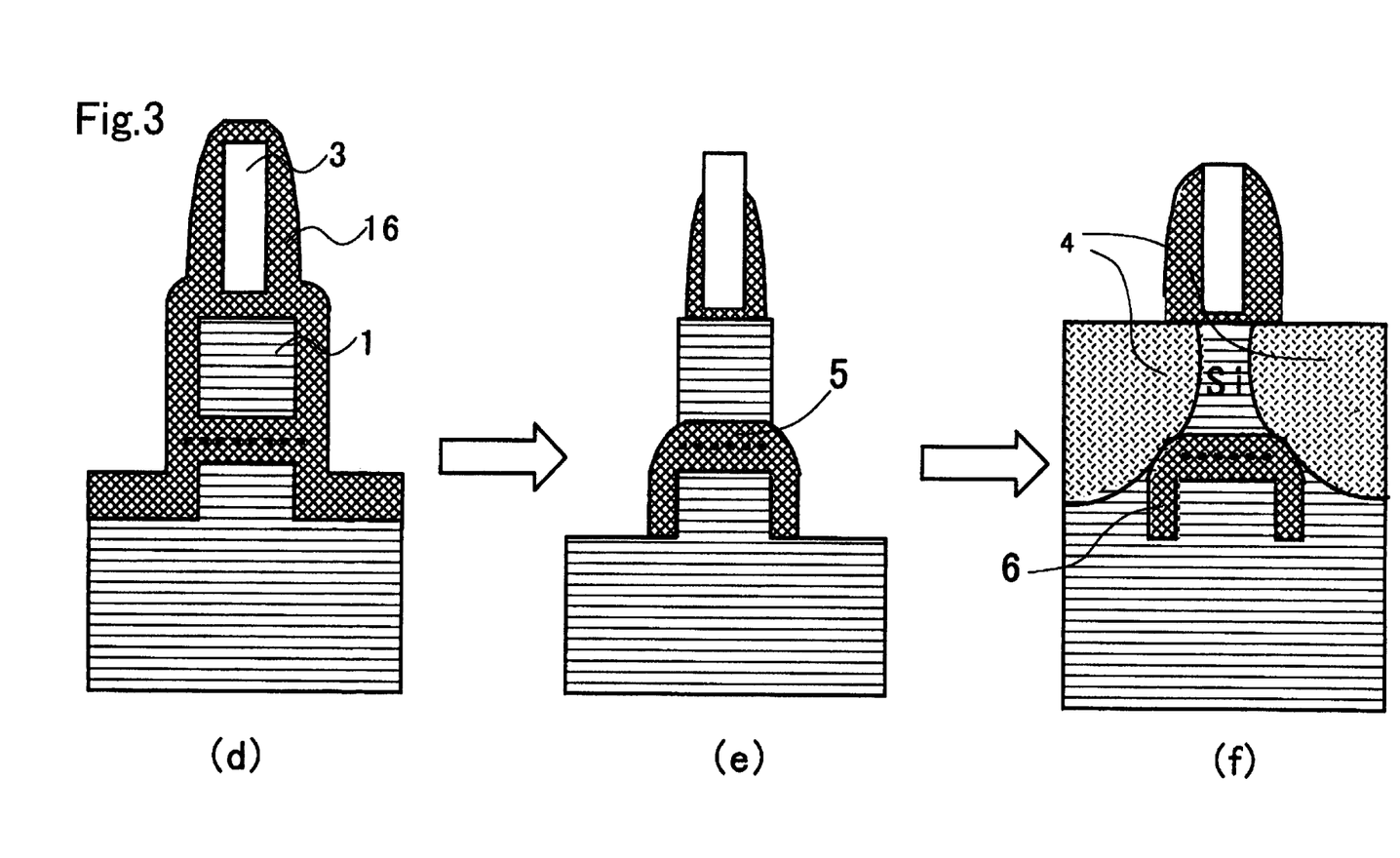
FIG. 3D shows a state in which a silicon oxide film is deposited.
FIG. 3E shows a state in which a sidewall is formed.
FIG. 3F shows a state in which the source/drain regions are formed.
Figure 4:
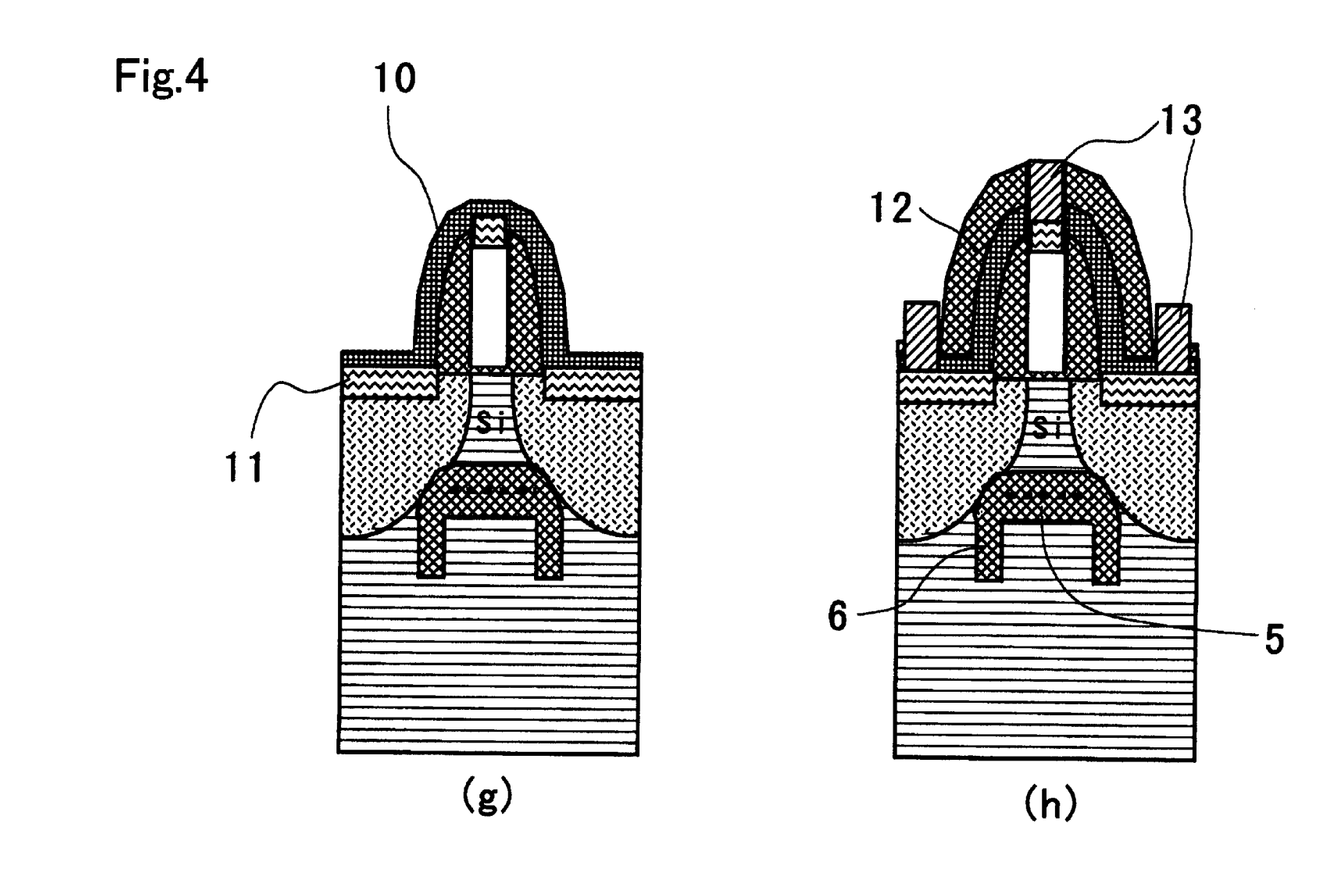
FIG. 4G shows a state in which a contact etching stop film is formed.
FIG. 4H shows a state in which an interlayer insulating film is formed, a contact hole is formed therein, and an electrode is formed.

FIGS. 2A to 2C, FIGS. 3D to 3F, and FIGS. 4G and 4H are diagrams showing a manufacture process for an MOS field effect transistor according to a first embodiment. FIG. 2A shows a state in which a gate insulating film and a gate electrode are formed in the Si/SiGe lamination structure, FIG. 2B shows a state in which source/drain regions are etched, and FIG. 2C shows a state in which an Si/SiGe layer is removed. FIG. 3D shows a state in which a silicon oxide film is deposited, FIG. 3E shows a state in which a sidewall is formed, and FIG. 3F shows a state in which the source/drain regions are formed. FIG. 4G shows a state in which a contact etching stop film is formed, and FIG. 4H shows a state in which an interlayer insulating film is formed, a contact hole is formed therein, and an electrode is formed.

As shown in FIGS. 2A to 2C, after a device isolation step, the lamination of Si 1 and SiGe 2 is selectively formed at an active region, then a gate insulating film 7 of SiON and a gate electrode 3 of polysilicon are formed. Next, a first sidewall 16 is formed on a side wall of the gate electrode 3, and the source/drain regions are etched using the first sidewall 16 as a mask. Then, the SiGe layer 2 is selectively removed by an ammonia-based etchant.

Next, as shown in FIGS. 3D to 3F, the first sidewall 16 on the gate electrode is removed, after which a silicon oxide film ($SiO_2$), for example, is buried in the cavity portion where SiGe 2 has been removed, and, at the same time, is deposited on the side wall of the gate electrode 3 and the side wall of the Si substrate by CVD. Then, by adjusting the over-etching amount by anisotropic etching, a second sidewall is formed in such a way as to cover the side wall of the box oxide film 5 and extend along the side wall and downward from the oxide-film buried region of the cavity portion. Next, source/drain regions are grown of Si by CVD, after which the first sidewall 16 is removed, a pocket and an extension impurity is doped to form the first sidewall 16 again on the side wall of the gate electrode 3. Then, an impurity is doped in the source/drain regions to provide a stressed thin film SOI structure.

Next, as shown in FIGS. 4G and 4H, after injected ions are activated by activation annealing, NiSi, for example, is formed as a silicide 11. A silicon nitride (SiN) film 10 having tensile stress, for example, is formed on NiSi as a contact etching stop film 10, after which an interlayer insulating film 12 is formed, a contact hole is formed, and the electrode 13 is formed, thereby completing the MOS field effect transistor according to the first embodiment.

As the box oxide film 5 is present only under the channel region and the second sidewall present on the side wall of the box oxide film 5 extends downward at the side face of the gate electrode 3 or the outer end portion of the first sidewall 16, and does not lie under the source/drain regions according to the structure, a low parasitic resistance and a high mobility can be achieved at a low cost.

Although the second sidewall is a single $SiO_2$ layer in the first embodiment, a double insulating film including the lamination of $SiO_2$ and SiON may be used instead. With this arrangement, it is possible to control stress to be applied to the substrate from the second sidewall, and optimize and increase the drive current.

Second Embodiment

Figure 5:
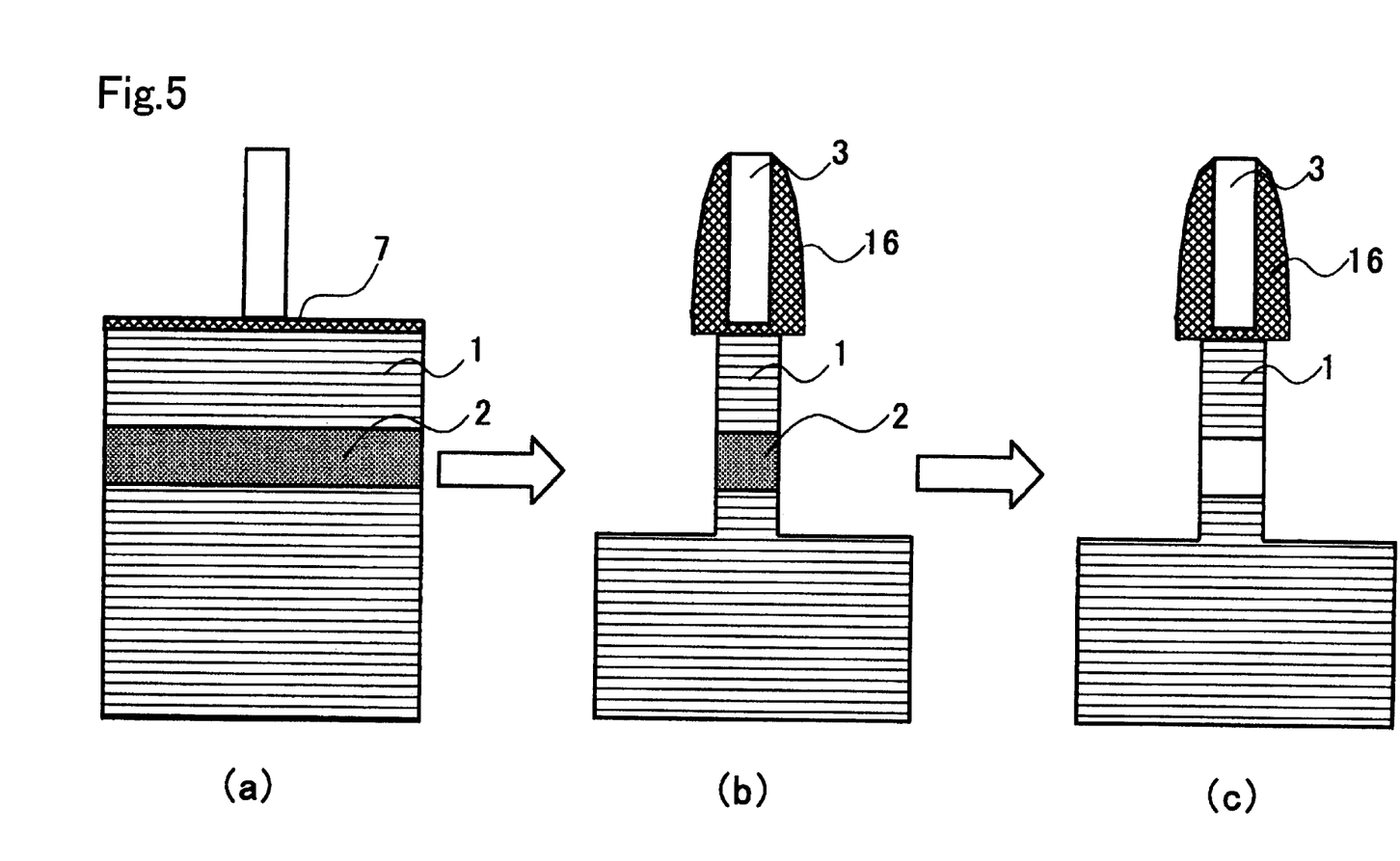
FIG. 5A shows a state in which a gate insulating film and a gate electrode are formed in an Si/SiGe lamination structure.
FIG. 5B shows a state in which source/drain regions are etched.
FIG. 5C shows a state in which an Si/SiGe layer is removed.
Figure 6:
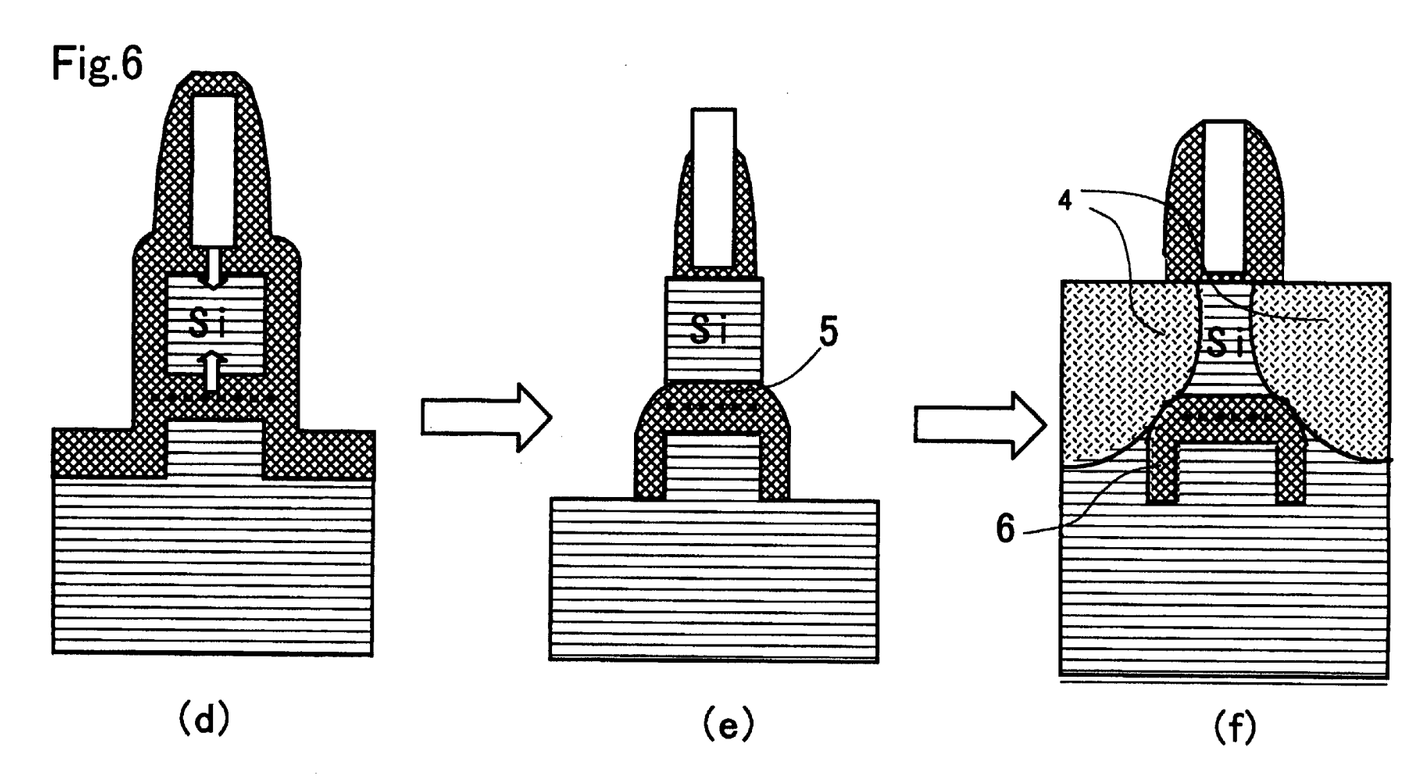
FIG. 6D shows a state in which a silicon oxide film is deposited by a thermal oxidization step.
FIG. 6E shows a state in which a sidewall is formed.
FIG. 6F shows a state in which the source/drain regions are formed.
Figure 7:
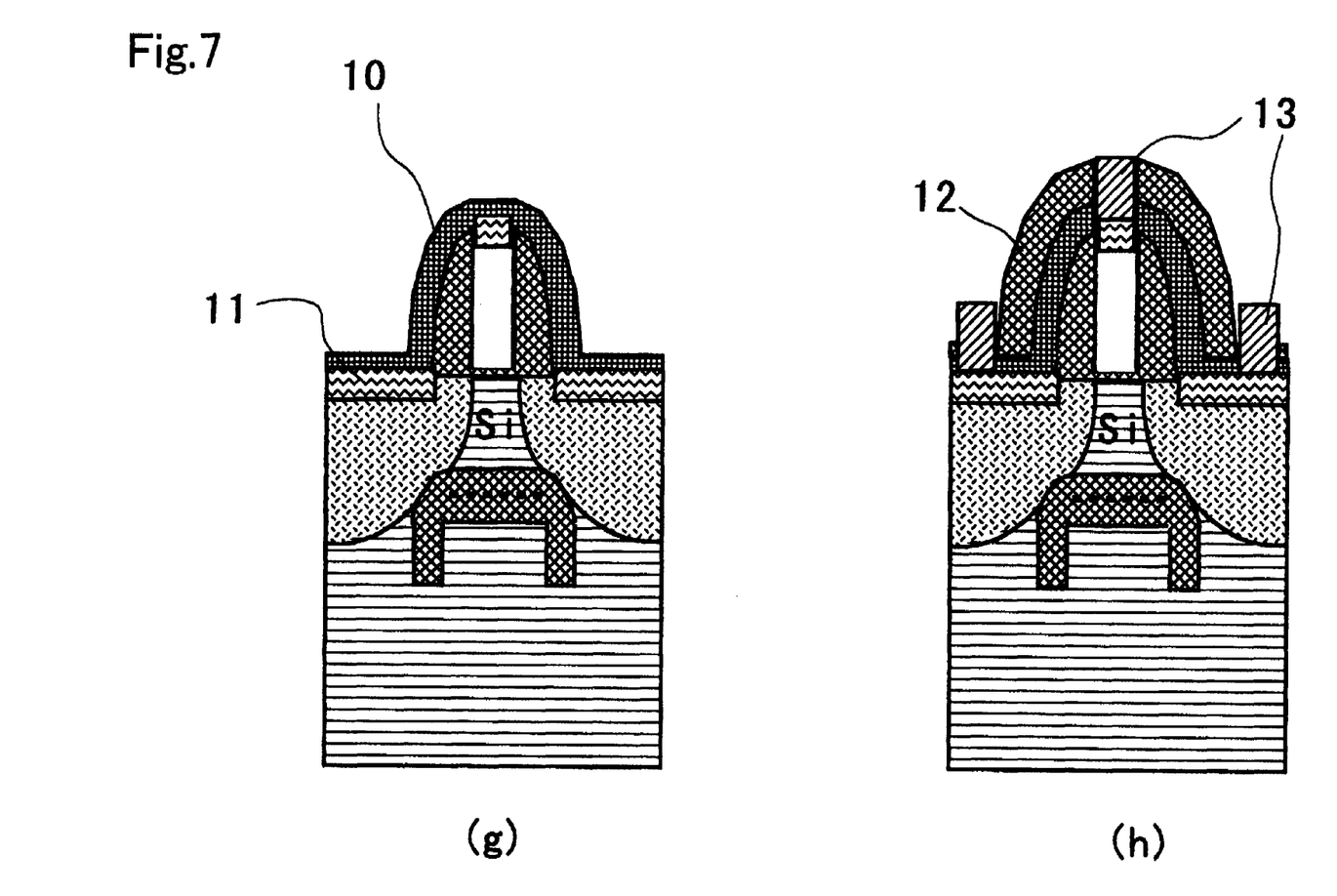
FIG. 7G shows a state in which a contact etching stop film is formed.
FIG. 7H shows a state in which an interlayer insulating film is formed, a contact hole is formed therein, and an electrode is formed.

FIGS. 5A to 5C, FIGS. 6D to 6F, and FIGS. 7G and 7H are diagrams showing a manufacture process for an MOS field effect transistor according to a second embodiment. FIG. 5A shows a state in which a gate insulating film and a gate electrode are formed in the Si/SiGe lamination structure, FIG. 5B shows a state in which source/drain regions are etched, and FIG. 5C shows a state in which an Si/SiGe layer is removed. FIG. 6D shows a state in which a silicon oxide film is deposited by a thermal oxidization step, FIG. 6E shows a state in which a sidewall is formed, and FIG. 6F shows a state in which the source/drain regions are formed. FIG. 7G shows a state in which a contact etching stop film is formed, and FIG. 7H shows a state in which an interlayer insulating film is formed, a contact hole is formed therein, and an electrode is formed.

As shown in FIGS. 5A to 5C, after a device isolation step, the lamination of Si 1 and SiGe 2 is selectively formed at an active region, and the gate insulating film 7 of SiON and the gate electrode 3 of polysilicon are formed. Next, the first sidewall 16 is formed on the side wall of the gate electrode 3, and the source/drain regions are etched using the first sidewall 16 as a mask. Then, the SiGe layer 2 is selectively removed by an ammonia-based etchant.

Next, as shown in FIGS. 6D to 6F, the first sidewall 16 on the gate electrode 3 is removed, after which a silicon oxide film ($SiO_2$), for example, is buried in the cavity portion where SiGe 2 has been removed, and, at the same time, is deposited on the side wall of the Si substrate by thermal oxidization different from the one used in the first embodiment. Through the process, in-plane tensile stress can be applied to the Si channel portion by compressing the Si channel portion vertically. Then, by adjusting the over-etching amount by anisotropic etching, a second sidewall is formed below the oxide-film buried region of the cavity portion in such a way as to extend the end portion of the box oxide film 5 downward. Next, source/drain regions are grown of Si by CVD, after which the first sidewall 16 is removed, a pocket and an extension impurity is doped to form the first sidewall 16 again. Then, an impurity is doped in the source/drain regions to provide a stressed thin film SOI structure.

Next, as shown in FIGS. 7G and 7H, after injected ions are activated by activation annealing, NiSi, for example, is formed as the silicide 11. The silicon nitride (SiN) film 10 having tensile stress, for example, is formed on NiSi as the contact etching stop film 10, after which the interlayer insulating film 12 is formed, a contact hole is formed, and the electrode 13 is formed, thereby completing the MOS field effect transistor according to the second embodiment.

As the box oxide film 5 is present only under the channel region and the second sidewall present on the side wall of the box oxide film 5 extends downward at the side face of the gate electrode 3 or the outer end portion of the first sidewall 16, and does not lie under the source/drain regions according to the structure, a low parasitic resistance and a high mobility can be achieved at a low cost as per the first embodiment.

Forming the box oxide film under the channel region by thermal oxidization can permit in-plane tensile stress to be applied to the channel Si, thereby improving the mobility and making the operation speed faster.

Although the second sidewall is a single $SiO_2$ layer in the second embodiment, a double insulating film including the lamination of $SiO_2$ and SiON may be used instead. With this arrangement, it is possible to control stress to be applied to the substrate from the second sidewall, and optimize and increase the drive current.

The present invention can provide a method of manufacturing an MOS field effect transistor which achieves a faster operation and lower power consumption by using a thin film SOI structure.

The manufacture method provides an MOS field effect transistor which is well matched with an existing process and is cost effective, without significantly changing the process steps.

What is claimed is:

1. An MOS field effect transistor comprising;
   a semiconductor substrate having a box oxide film between source/drain regions;
   a channel layer on the box oxide film;
   a gate electrode formed on the channel layer via a gate insulating film;
   a first sidewall which covers the gate electrode; and
   source/drain regions formed self-aligned with a side of the gate electrode; and
   a second sidewall which covers the box oxide film, extends downward from a bottom face of the box oxide film, and lies between the source/drain regions.

2. The MOS field effect transistor according to claim 1, wherein the second sidewall is formed downward from each of the source/drain regions, and overlies a pn junction interface of the source/drain regions.

3. The MOS field effect transistor according to claim 1 or 2, wherein the second sidewall comprises a silicon oxide film formed by CVD.

4. The MOS field effect transistor according to claim 1 or 2, wherein the second sidewall comprises a silicon oxide film formed by thermal oxidization.

* * * * *